United States Patent [19]

Bocchicchio et al.

[11] Patent Number: 4,631,815
[45] Date of Patent: Dec. 30, 1986

[54] PICK-UP HEAD

[75] Inventors: Keith A. Bocchicchio, Middletown; David L. Hall, Hummelstown, both of Pa.

[73] Assignee: AMP Incorporated, Harrisburg, Pa.

[21] Appl. No.: 811,143

[22] Filed: Dec. 18, 1985

[51] Int. Cl.⁴ ........................................... H05K 13/04
[52] U.S. Cl. ...................................... 29/739; 29/743; 29/759; 294/64.1; 901/40
[58] Field of Search ......................... 29/739, 743, 759; 414/737, 744 B, 752; 901/40; 294/64.1

[56] References Cited

U.S. PATENT DOCUMENTS

| | | | |
|---|---|---|---|
| 3,089,600 | 5/1963 | Fischer, Jr. | 294/64.1 |
| 4,079,489 | 3/1978 | Kowalski et al. | 29/743 |
| 4,173,426 | 11/1979 | Schell | 414/737 |
| 4,433,863 | 2/1984 | Mathews | 294/64.1 |
| 4,590,673 | 5/1986 | Dornes et al. | 29/739 |

Primary Examiner—Lowell A. Larson
Attorney, Agent, or Firm—Thomas G. Terrell

[57] ABSTRACT

A robot pick-up head for an electrical connector with a hollow rivet at each end, comprises a body for attachment to the Z axis shaft of a robot. In the body are a pair of spring loaded pins, one on each side of the Z axis, and between the pins, is a spring loaded vacuum block. The pins terminate in tapered spigots for insertion into the hollow rivets. When the connector is to be picked up, the spigots are inserted into the rivets with the full force of the robot so that if the rivets are initially canted with respect to the connector, the rivets are straightened. The vacuum block then engages the housing of the connector and is evacuated so that the connector is picked up as the robot shaft rises. The loading springs of the vacuum block are softer than those of the pins so that the connector housing is not damaged when it is engaged by the vacuum block.

6 Claims, 14 Drawing Figures

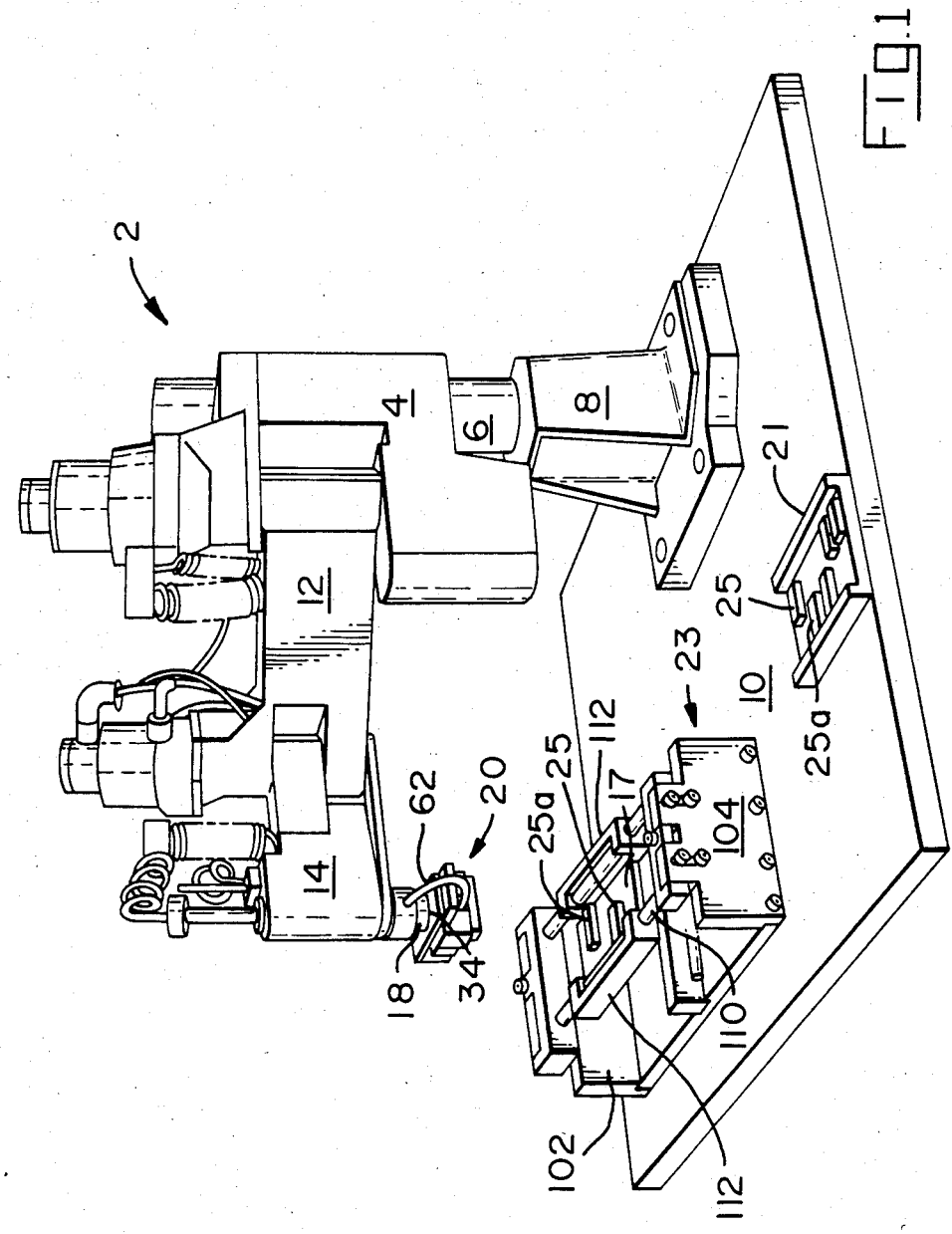

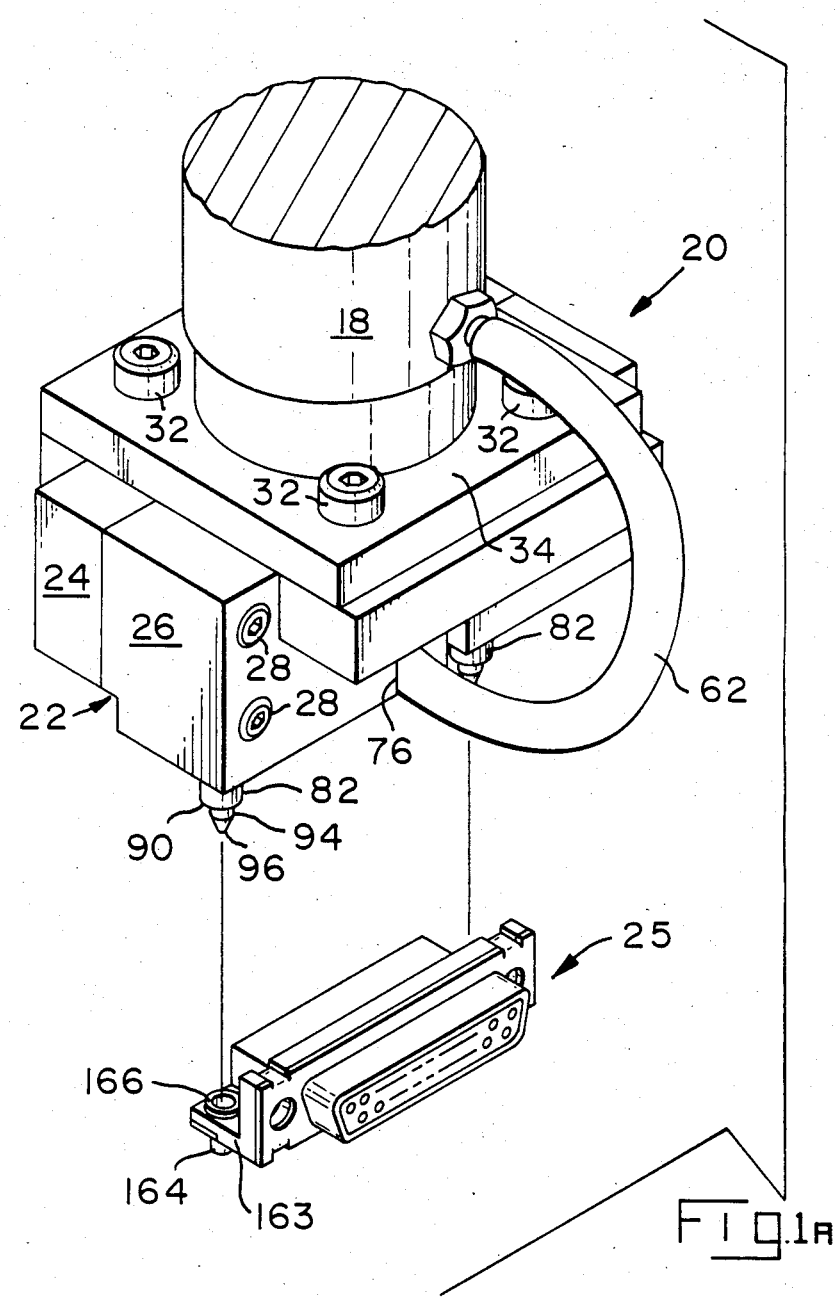

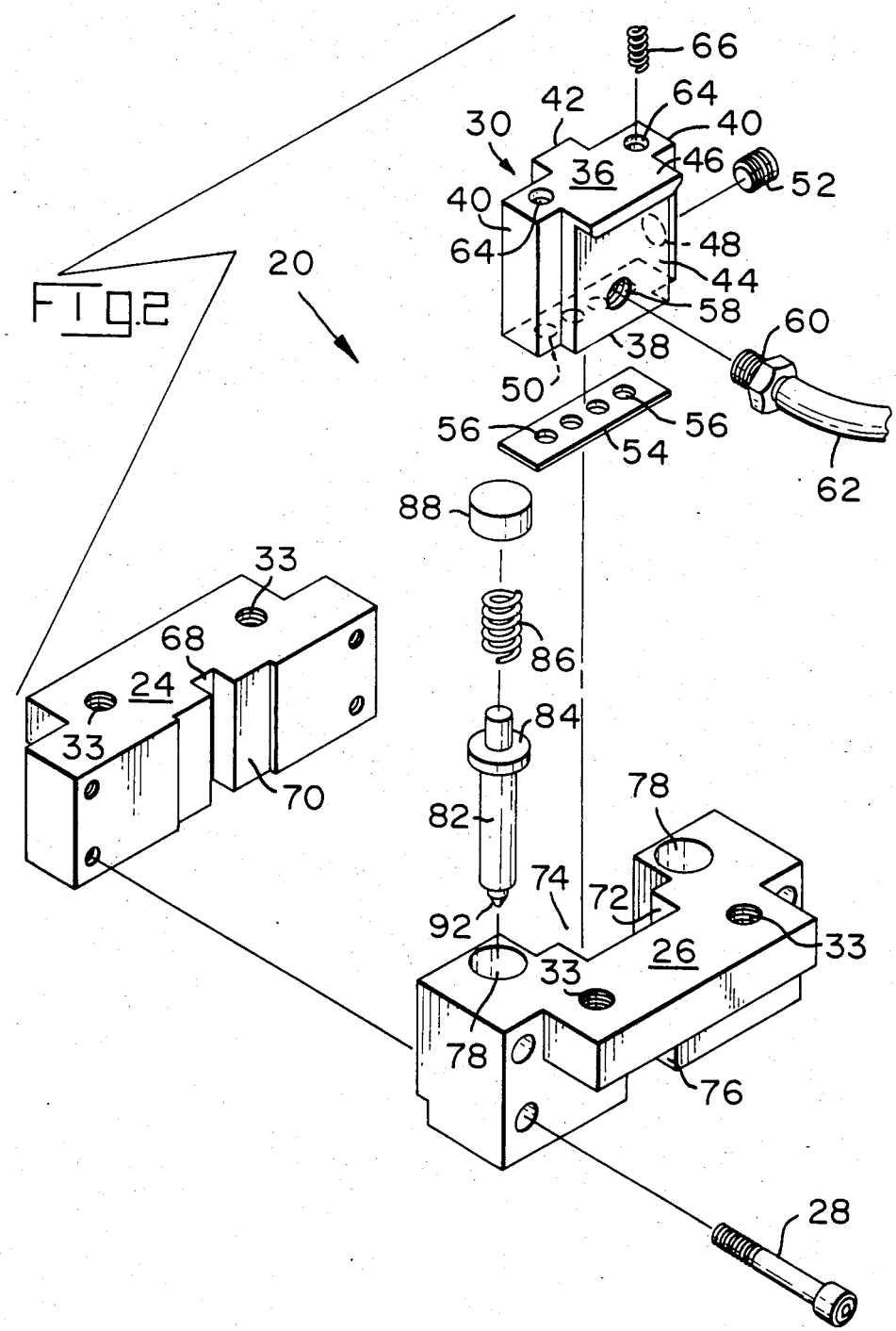

PICK-UP HEAD

This invention relates to a pick-up head for use in picking up a workpiece having a pair of hollow rivets depending in spaced relationship from a lower surface thereof and opening into an upper surface thereof, and moving the workpiece towards a board to place said lower surface thereon, thereby to insert said rivets into predetermined holes in the board.

The invention particularly concerns such a pick-up head for use with a pick and place robot for picking up electrical connectors from a pick-up station and for placing them on a circuit board. In such an operation, it is essential that the rivets should be precisely aligned with the holes in the board in which they are to be inserted. However, for various reasons, for example for reasons of manufacturing tolerance and because the rivets may be canted slightly with respect to the body of the connector, from which they project, as a result of the connectors being handled, said precise alignment may not necessarily be achieved.

According to the invention, the pick-up head comprises a body having a central vertical axis, and upper and lower faces; means on said upper face for attaching said body to a longitudinally movable shaft with said central axis coincident with the axis of the shaft, first and second pins slidably mounted in said body and extending parallel to said central axis at positions spaced therefrom and being disposed on opposite sides of said central axis, the pins having free end portions projecting below said lower face and terminating in tapered spigots for reception in said hollow rivets; a spring loaded vacuum block slidably mounted for vertical movement in said body between said pins; an evacuable manifold in said body having means for connection to an evacuating pump and opening between said free end portions for engagement with said upper surface of said workpiece; and first and second springs connected to said pins and to said vacuum block, respectively, and against the action of which said pins and said vacuum block are movable upwardly in said body. By virtue of said first springs, the spigots can be driven into the hollow rivets with very substantial force, so that the spigots force the rivets into precise vertical alignment for insertion in the holes in the board. The second springs are preferably softer than the first springs, so that the vacuum block, when driven against the workpiece, does not damage it.

In operation, when the spigots have been driven home into the rivets, the vacuum block engaging the workpiece, between the rivets, the manifold is evacuated so that the workpiece is firmly secured to the pick-up head for transfer to the board. Upon each rivet being inserted into a predetermined hole in the board, and after the rivets have been subjected to a clinching operation to secure the workpiece to the board, the manifold is filled and the pick-up head is raised from the workpiece, leaving it secured to the board.

Preferably, each pin has a flat free end face from which the spigot projects, the spigot having a portion of constant circular cross section, adjacent to said flat face and terminating in a downwardly tapered and pointed free end portion.

Conveniently, the body comprises front and back plates, which are releasably secured together, and which define a slideway for the vacuum block, which is preferably guided in the slideway by means of splines on the block which engage in vertical grooves in the said plates.

The springs may act between the body and a top plate thereon which is secured to the shaft.

For a better understanding of the invention reference will now be made by way of example to the accompanying drawings in which:

FIG. 1 is a perspective view of a pick and place robot operatively arranged in a work area in association with an electrical connector pick-up station and an electrical connector assembly station in the form of a clinching apparatus;

FIG. 1A is a perspective view of an electrical connector pick-up head on a shaft of the robot, an electrical connector being shown as exploded from the pick-up head;

FIG. 2 is an exploded perspective view of the pick-up head;

Figure 3:
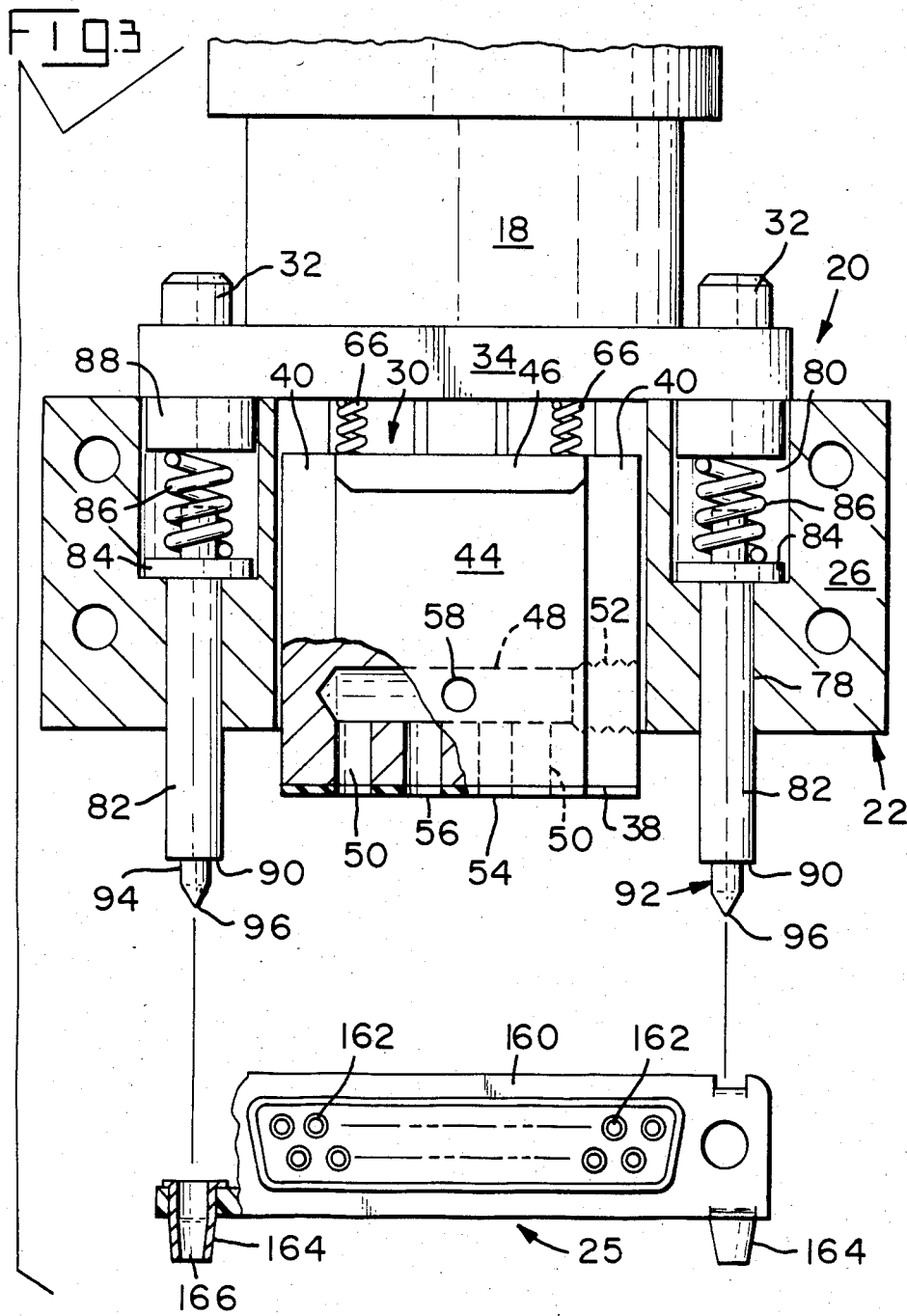
FIG. 3 is a front elevation of FIG. 1A, shown mainly in section.

As shown in FIG. 1, a robot 2 comprises a body 4 mounted for rotation about, and movement along, the axis of a vertical shaft 6 in a stand 8 secured to a work table 10. Mounted on the body 4 for rotation about a vertical axis, is a first arm 12 carrying at its end remote from the body 4, a second arm 14 which is rotatable relative to the arm 12, also about a vertical axis. A vertical shaft 18 which is rotatable about a vertical axis and which is also extensible and retractable along such axis depends from the arm 14 at its end remote from the arm 12. The axis of the shaft 18 is known as the Z axis of the robot. The body 4 is clamped, prior to use of the robot 2, in a desired angular position, and in a desired vertical position, with respect to the shaft 6. The rotation of the arms 12 and 14, and the shaft 18, as well as the axial vertical movement of the shaft 18, are selectively controllable by means of a microprocessor (not shown) in accordance with a predetermined program.

A connector pick-up head 20, is fixedly mounted on the shaft 18.

An assembly station 23 on the table 10 supports thereon, a circuit board 19. Also on the work table 10 is a connector pick-up station 21 containing identical electrical connectors 25, to be mounted, at accurately predetermined positions, on the board 19.

The robot 2 is operated under the control of the microprocessor to swing the head 20 over the pick-up station 21, to lower the head 20 to engage the leading connector 25 at the station 21, to cause the head 20 to grip that connector, to raise the head 20, to swing it to a position over the board 19, to lower the head 20 to position the connector 25 on the board 19, to cause the head 20 to release the connector 25 to raise the head 20 and subsequently to cause the head 20 to pick up a further connector 25a from the station 21 and position it on the board 19. The program ensures that the head 20 is rotated about the vertical axis of the shaft 18 so that it is suitably oriented for each pick-up and place operation.

The pick-up head 20 will now be described with reference to FIGS. 1A to 4. The head 20 comprises a body 22 having a central vertical axis, which is that of the shaft 18. The body 22 comprises back and front plates 24 and 26, respectively, secured together by bolts 28 and slidably receiving between them a vacuum block 30. The body 22 is secured by means of bolts 32 threaded in tapped holes 33 in the plates 24 and 26, to a horizontal top plate 34 secured to the robot shaft 18. The vacuum block 30 has an upper face 36, a lower face 38, opposed lateral keying splines 40, a rear keying spline 42, and a forward keying spline 44 from which projects at the upper face 36, a keying ledge 46 which overhangs the spline 44. There is formed in the block 30, an air manifold comprising a vacuum chamber in the form of a horizontal blind conduit 48 with which communicate a series of vertical conduits 50 each of which opens into said lower face 38. The conduit 48 has a tapped open end which is closed by a screw plug 52. A bottom plate 54 fitted to the face 38 is formed with holes 56 each communicating with a respective conduit 50. A tapped opening 58 in the spline 44, which opening communicates with the conduit 48, receives a threaded adaptor 60 on one end of an air hose 62, the other end of which is connected via the robot to an evacuation pump (not shown). Bores 64 in the upper face 36 receive springs 66, engaging the plate 34 on the robot shaft 18.

The back plate 24 has a vertical groove 68 receiving the spline 42, and opening into a shallow recess 70 receiving the splines 40, the front plate 26 having a vertical groove 72 receiving the ledge 46 and the spline 44 and opening into a recess 74 also receiving the splines 40, as will best be apparent from FIG. 2. The groove 72 communicates with a slot 76 in the plate 26 accommodating the hose 62 as shown in FIG. 1A. There are formed in the plate 26, at opposite ends thereof, vertical bores 78 having countersinks 80 and each of which slidably receives a pin 82 having a head 84 in the countersink 80, a loading spring 86 acting between each head 84 and a disc 88 in the corresponding countersink 80, which disc is urged against the plate 34 by the spring 86. The pins 82 are parallel to, and are equally spaced from, the said control axis on opposite sides thereof. Each pin 82 has below the lower surface of the body 22 and the block 30, a flat free end face 90, from which projects a spigot 92 having a portion 94, of constant circular cross-section, adjacent to the face 90 and terminating in a downwardly tapered and pointed, free end portion 96.

The plate 54 lies between the end portions of the pins 82 which project below the lower face of the body 22.

Figure 5:
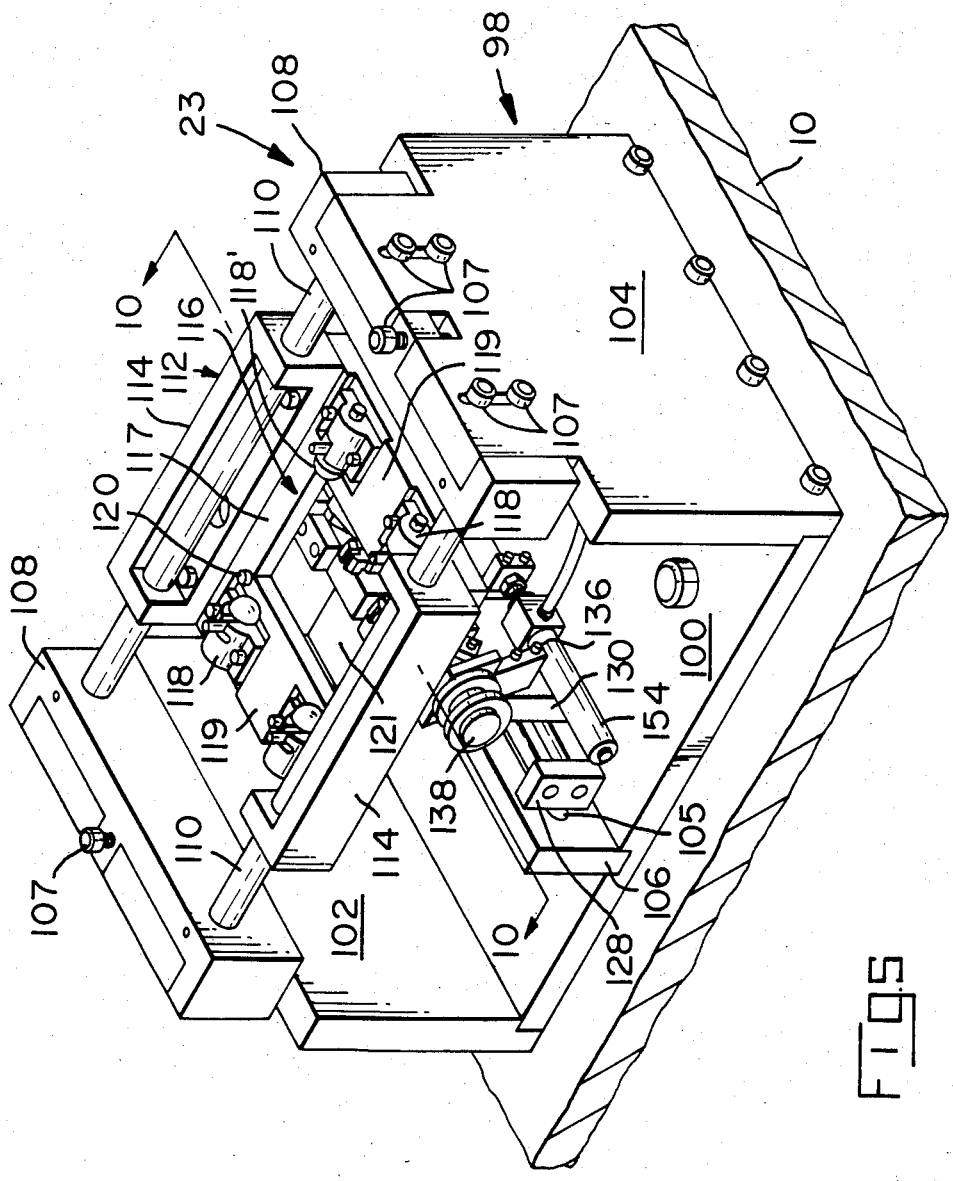
FIG. 5 is a perspective view of the assembly station with parts removed.

The assembly station 23, which is in the form of a clinching apparatus, will now be described with reference to FIGS. 5 to 11. As best seen in FIG. 5, the station 23 comprises a frame 98 having a base plate 100 and side plates 102 and 104 and a stub center plate 106, upstanding vertically from the plate 100. The plate 106 has a central longitudinal slot 105. To the upper part of each of the side plates 102 and 104, there is secured by screws 107 and 107', for vertical adjustment, a yoke 108, supporting horizontally spaced first rectilinear rails 110 upon which is mounted a board support shuttle 112 comprising a pair of horizontally spaced brackets 114 slidable along the rails 110 and carrying a board support frame 116 which is rectangular. The shuttle 112 has side portions 117 and end portions 119 defining a central rectangular opening 121, and has on each end portion 119 spring loaded, board hold down buffers 118, having spring loaded plungers 118', and one end portion 119, nearest the plate 102, board locating studs 120. On its outer side, each portion 117 has exchangeably secured thereto, a horizontally stepped cam track 122. The screws 107 extend through the yokes 108 and are adjustable to raise or lower the shuttle 112 after loosening the screws 107' which extend through the plates 102 and 104.

Figure 8:
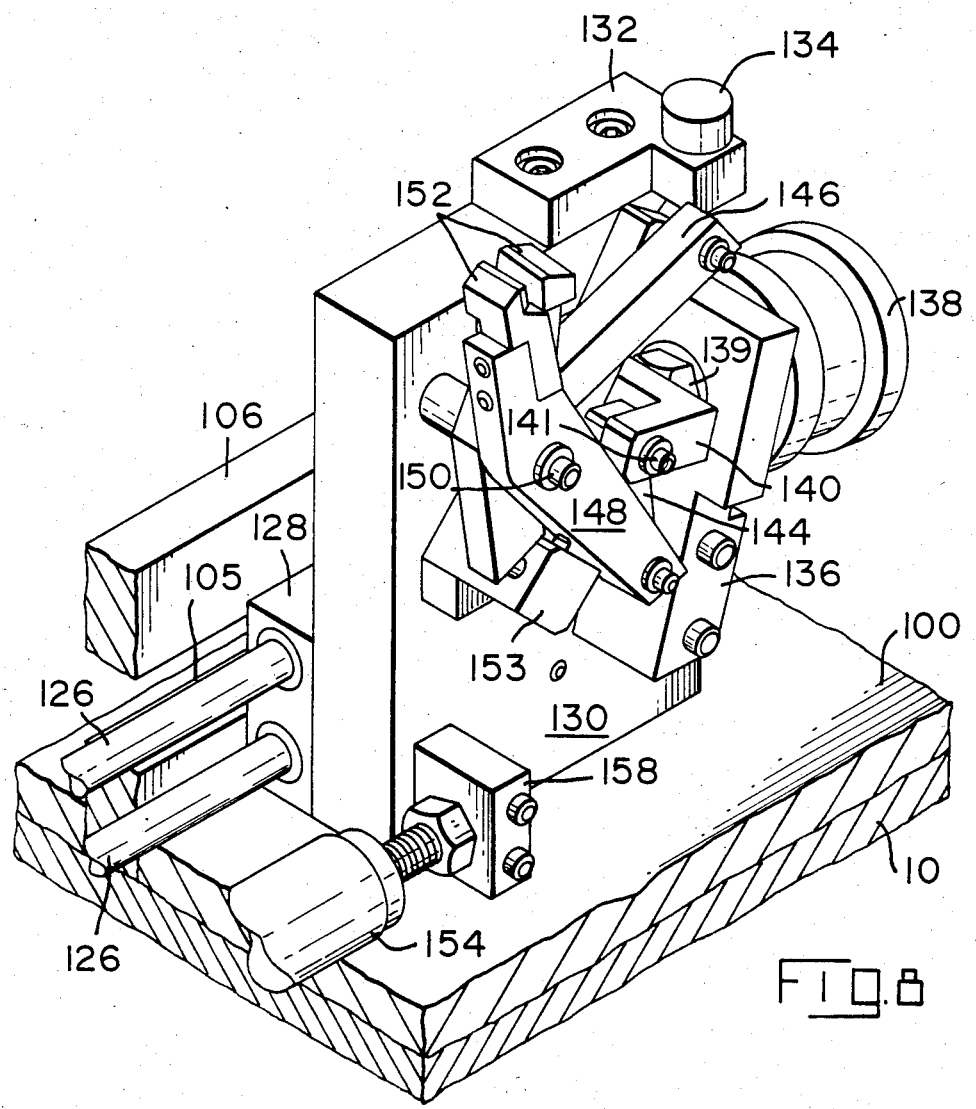
FIG. 8 is a fragmentary view of part of the assembly station.
Figure 9:
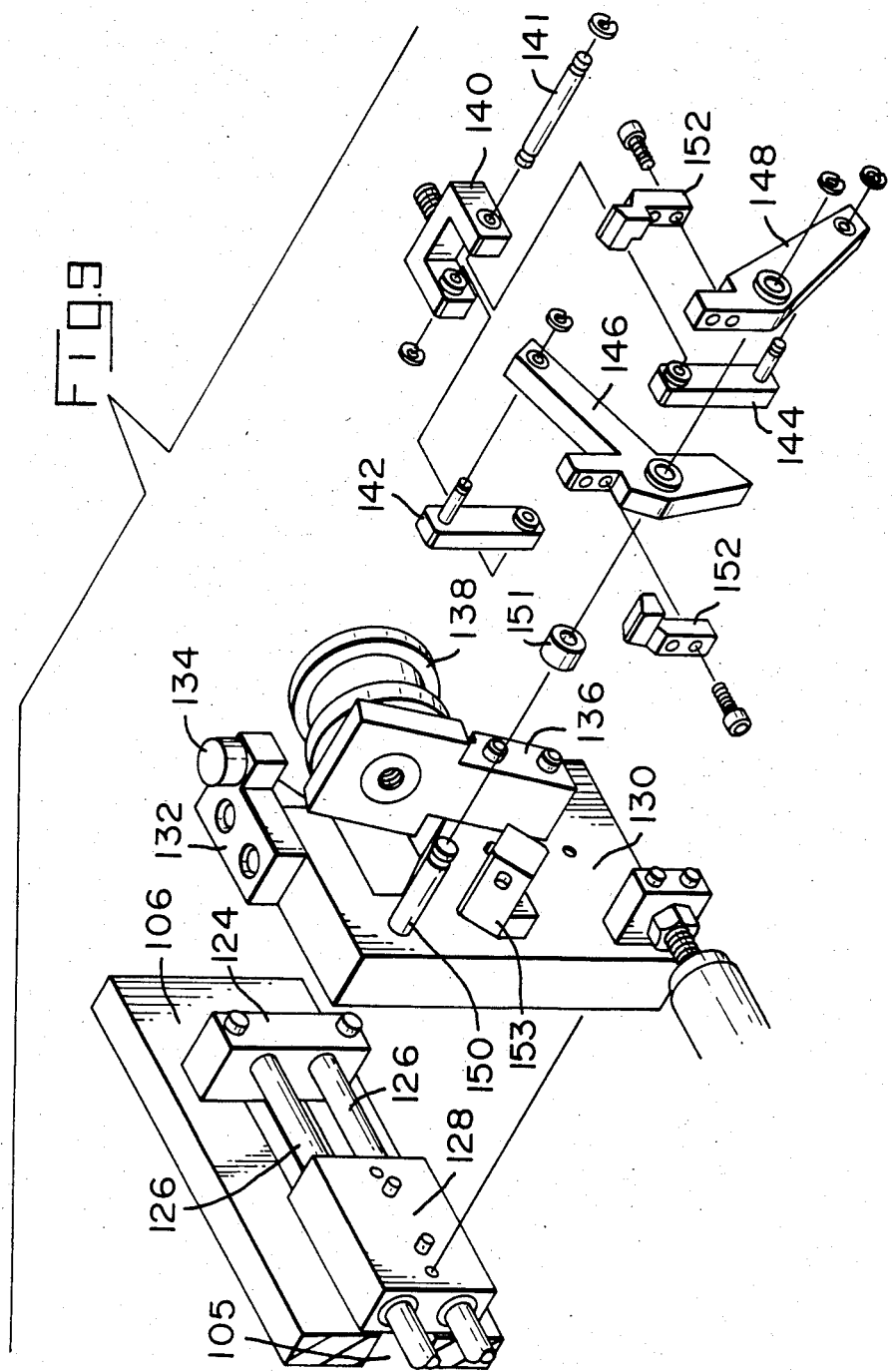
FIG. 9 is an exploded perspective view of the part shown in FIG. 8.

Support blocks 124 fixed to one side of the plate 106, carry vertically spaced second rectilinear rails 126, extending at right angles to the rails, 110 and on which are slidably mounted jaw carriage supports 128 (only one of which is shown). There is fixed to each support 128, a jaw carriage 130 to the outer end of the upper edge of which is secured a cam follower support block 132 bearing a cam follower roll 134 as best seen in FIGS. 8 and 9. Each carriage 130 has secured thereto on a bracket 136, a jaw drive pneumatic piston and cylinder unit 138 having a piston rod 139 bearing a clevis 140 to which are pivotally connected by means of a pin 141 toggle links 142 and 144, which are in turn pivotally connected to jaw carrying levers 146 and 148, respectively which are pivotable about a common pin 150 on the carriage 130, a washer 151 being interposed between the lever 146 and the carriage 130 (FIG. 9). A clinching jaw 152, of a pair of such jaws, is fixed to the upper end of each lever 146 and 148. The throw of the levers 146 and 148 is limited by a stop block 153 on the carriage 130. A cylinder of a jaw carriage return pneumatic piston and cylinder unit 154 having a piston rod 156 secured by a block 158 to one of the carriages 130, is fixed to the other carriage 130 as best seen in FIG. 5.

Figure 12A:
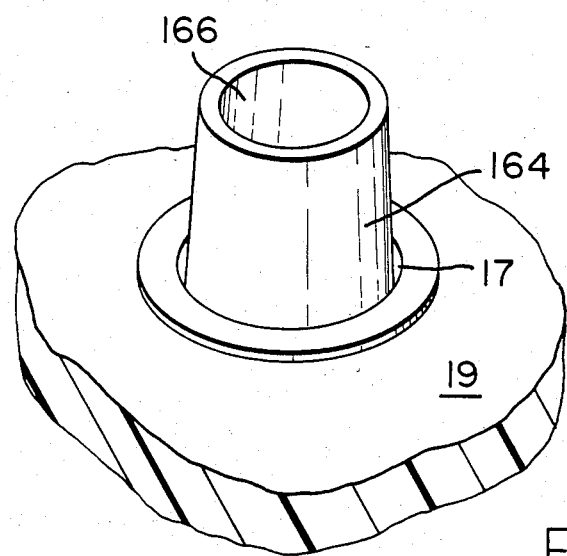
FIG. 12A is a fragmentary perspective view showing a rivet on the connector projecting through a hole in the circuit board.
Figure 12B:
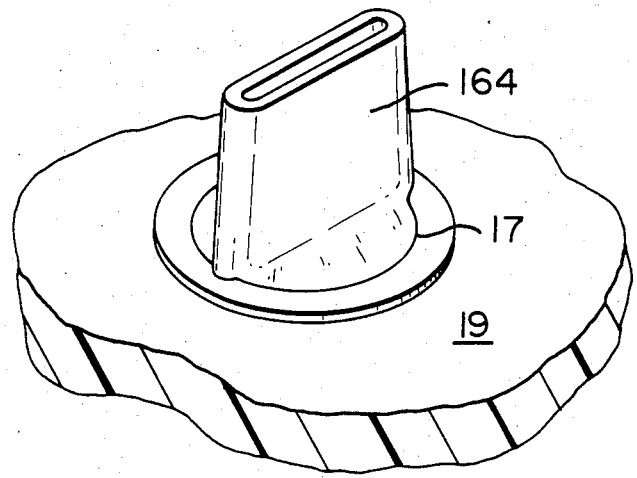
FIG. 12B is a similar view to that of FIG. 12A but showing the rivet after having been clinched to secure the connector to the circuit board.

Each electrical connector 25 has a mating face 160 in which are pin socket terminals 162 (FIG. 3). There depends from each end mounting flange 163 of the connector 25 a hollow rivet 164 having a bore 166, for reception in an appropriate hole 17 in the circuit board 19 as shown in FIG. 12A. When a rivet 164 has been inserted through the hole 17, that end of the rivet which projects beneath the board 19 can be clinched, that is to say flattened, as shown in FIG. 12B, to secure the connector 25 to the board 19.

For the assembly of connectors 25 thereto, the board 19 is placed on the board support frame 116, the spring loaded pluggers 118' of the buffers 118 being thereby displaced and then returning to project over the board 19 to hold it down on the frame 116.

Figure 4:
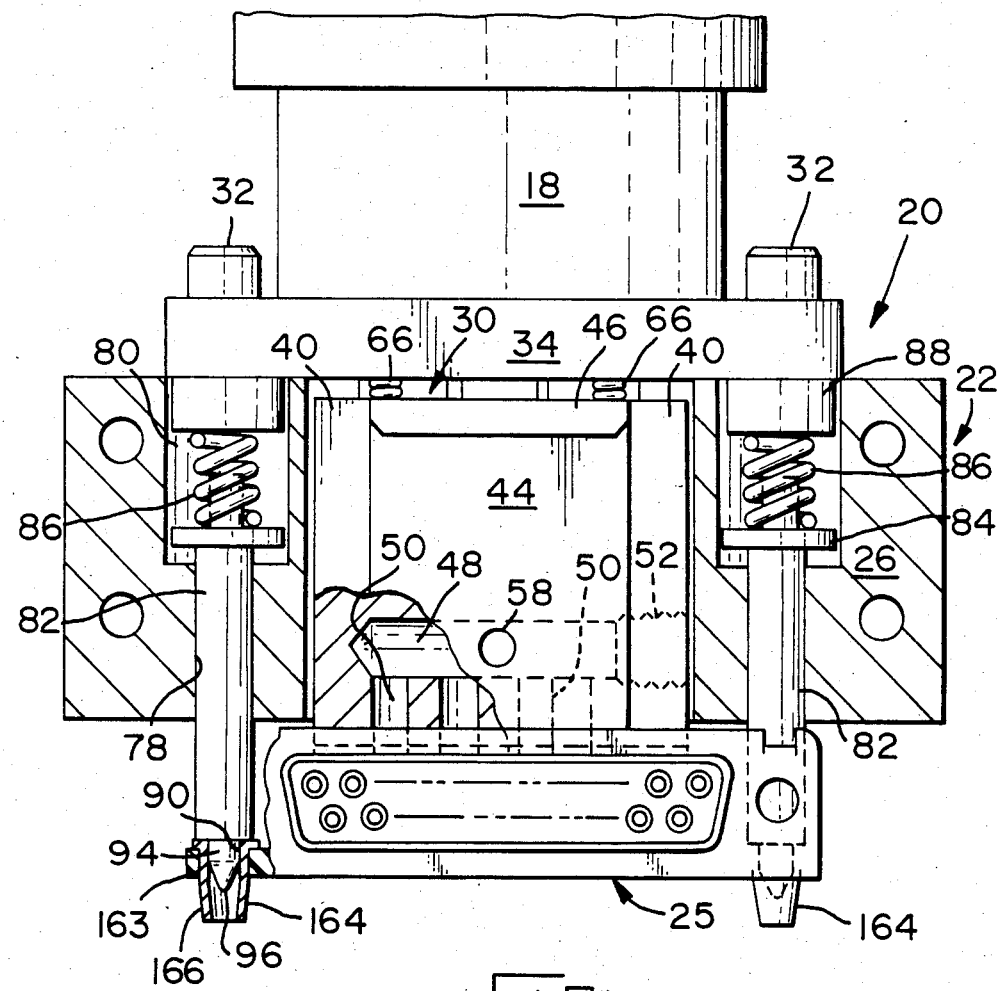
FIG. 4 is a similar view to that of FIG. 3, but showing, partly in section, the connector when it has been picked up by the pick-up head.

In operation, when the head 20 is lowered to pick up the leading connector 25 from the station 21, the tapered portions 96 of the spigots 92 enter the respective rivets 164 of said leading connector as shown in FIG. 4. As the pins 82 are spring loaded, the head 20 may be brought down on the connector with the full force of the robot 2, so that the cylindrical portions 94 are driven into the bores 166 of the rivets 164, whereby should the rivets initially not extend exactly normally of the connector, the rivets are aligned so to extend, and vacuum block 30 which is also spring loaded, engages the connector also as shown in FIG. 4. The connector 25 is not thereby damaged as the springs 66 are somewhat softer than the springs 86. Before the head 20 is raised to pick up the connector 25, the vacuum pump is operated, in accordance with the robotic program, to evacuate the conduit 48, so that the connector 25 is firmly secured to the head 20.

Figure 10:
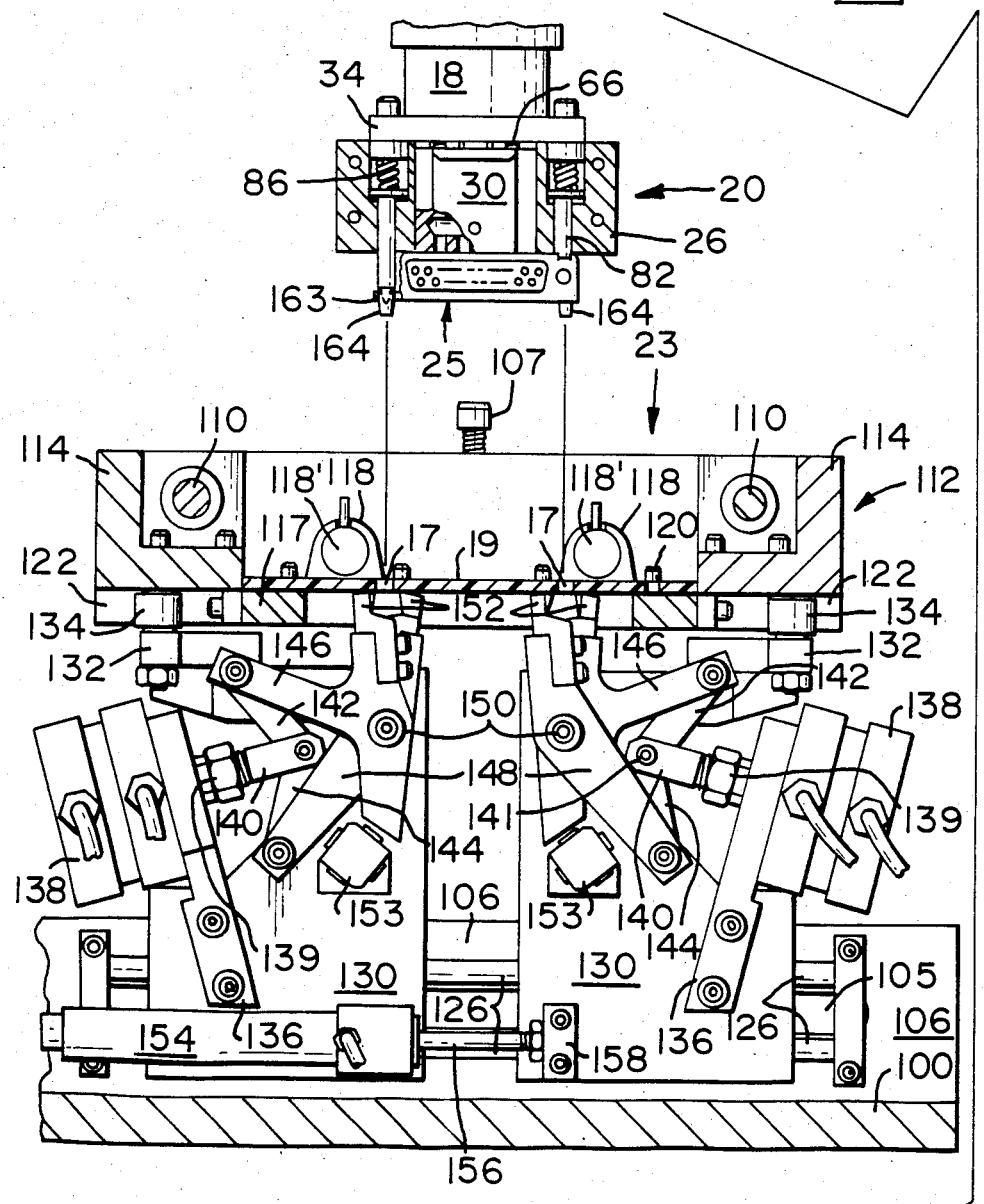
FIG. 10 is a sectional view taken on the lines 10—10 of FIG. 5 and showing the pick-up head on the robot shaft, the former also being shown in section, as having picked-up the connector, and as being exploded from the assembly station.
Figure 11:
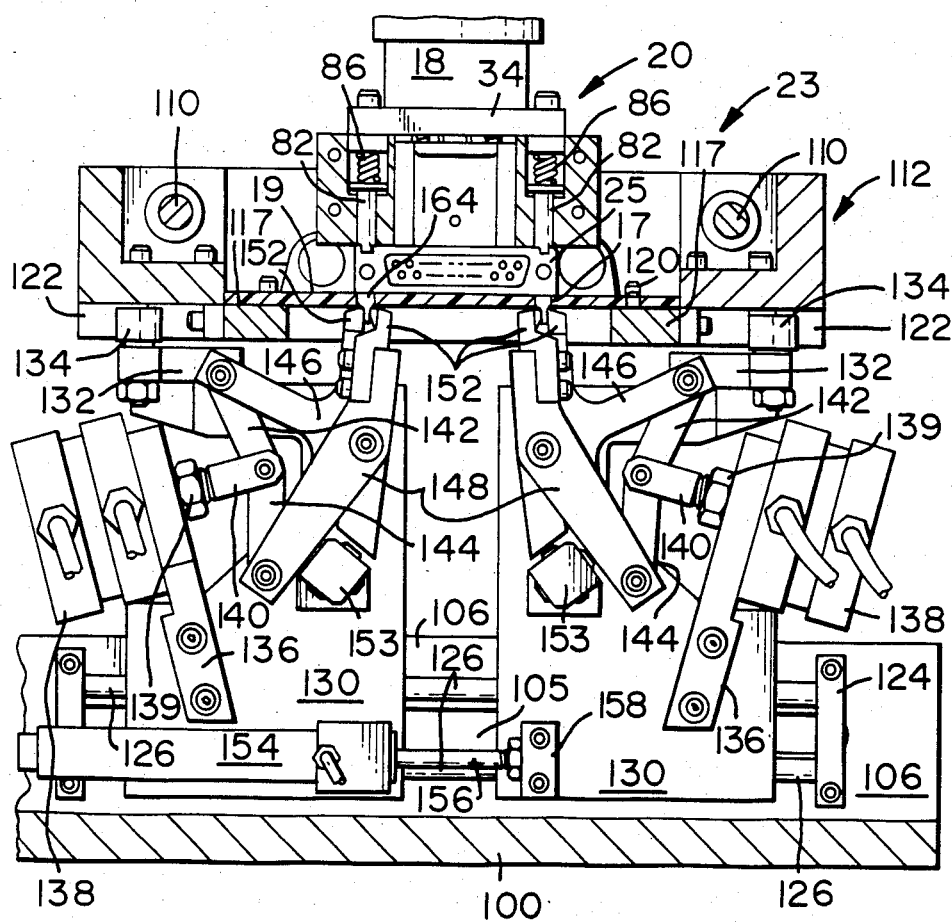
FIG. 11 is a similar view to that of FIG. 10 but showing the connector assembled to a circuit board at the pick-up station.

Also, in accordance with the program, the robot subsequently lowers the head 20 to insert the rivets 164 of the connector 25 in respective selected holes 17 in the board 19, the head 20 then being moved horizontally by the robot 2, to advance the shuttle 112 along the rails 110, in the direction of the arrow X in FIG. 6, towards the jaws 152. During the advance of the shuttle 112, the cam tracks 122, which have been selected according to the program, drive the cam follower rolls 134 and thus the jaw carriages 130 horizontally towards the rivets 164, along the rails 126, in the directions of the arrows Y in FIG. 6. Since, according to the program, the piston rods 139 of the units 138 are now in their advanced positions as shown in FIG. 10, the jaws 152 of each pair are in an open position so that each rivet 164 is received between the jaws of a respective pair (FIG. 7), as the carriage 112 is advanced, at which time the horizontal movement of the head 20 is stopped and the piston rods 139 are retracted so that as shown in FIG. 11, the rivets 164 are clinched between the jaws 152 to secure the connector 25 to the board 19. The conduit 48 is now filled so that the connector 25 is released and the head 20 is raised to pick up the next following connector 25a leaving the connector 25 fixed to the board 17. The piston rods 139 are now advanced to open the pairs of jaws 152.

Figure 6:
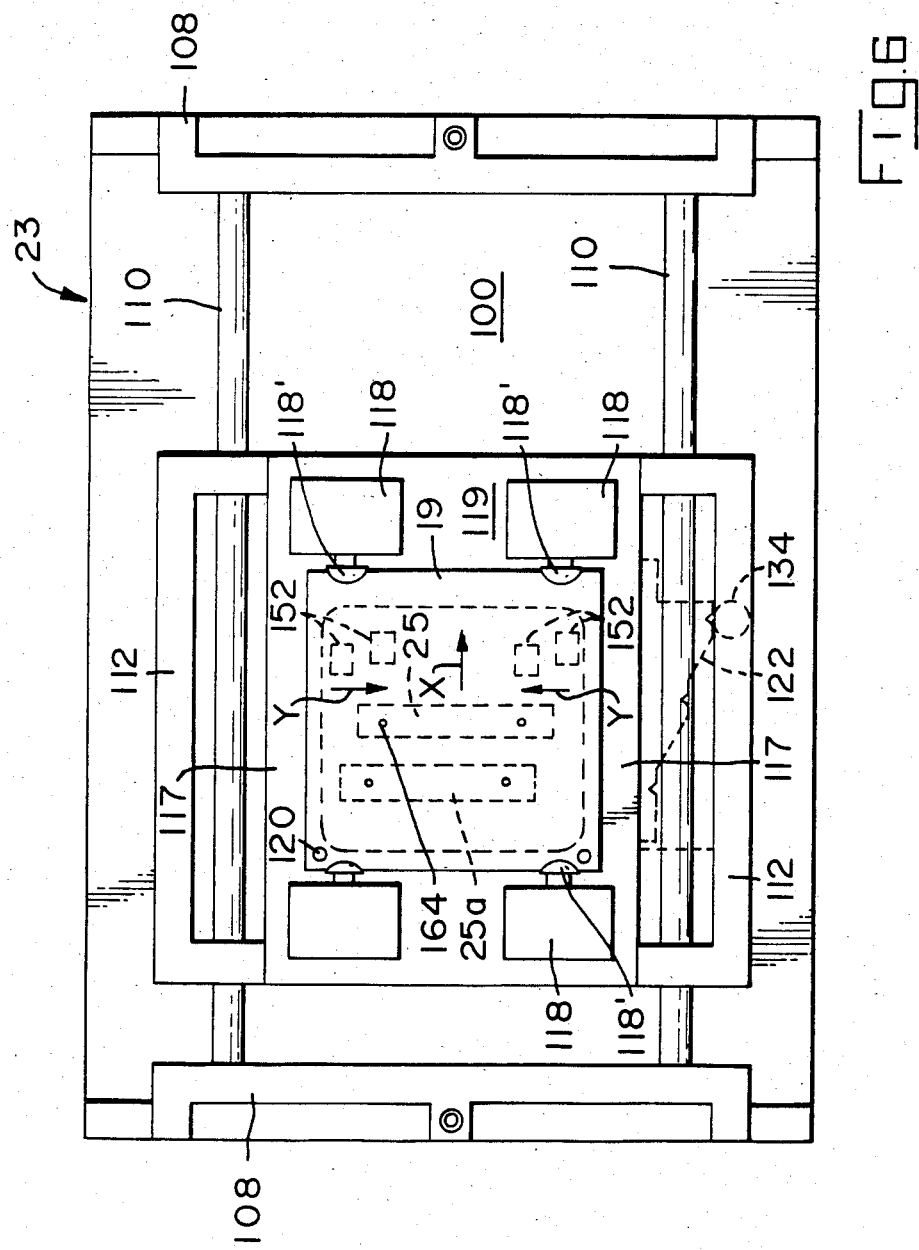
FIG. 6 is a diagrammatic plan view of the assembly station, showing a shuttle thereof in a first position.
Figure 7:
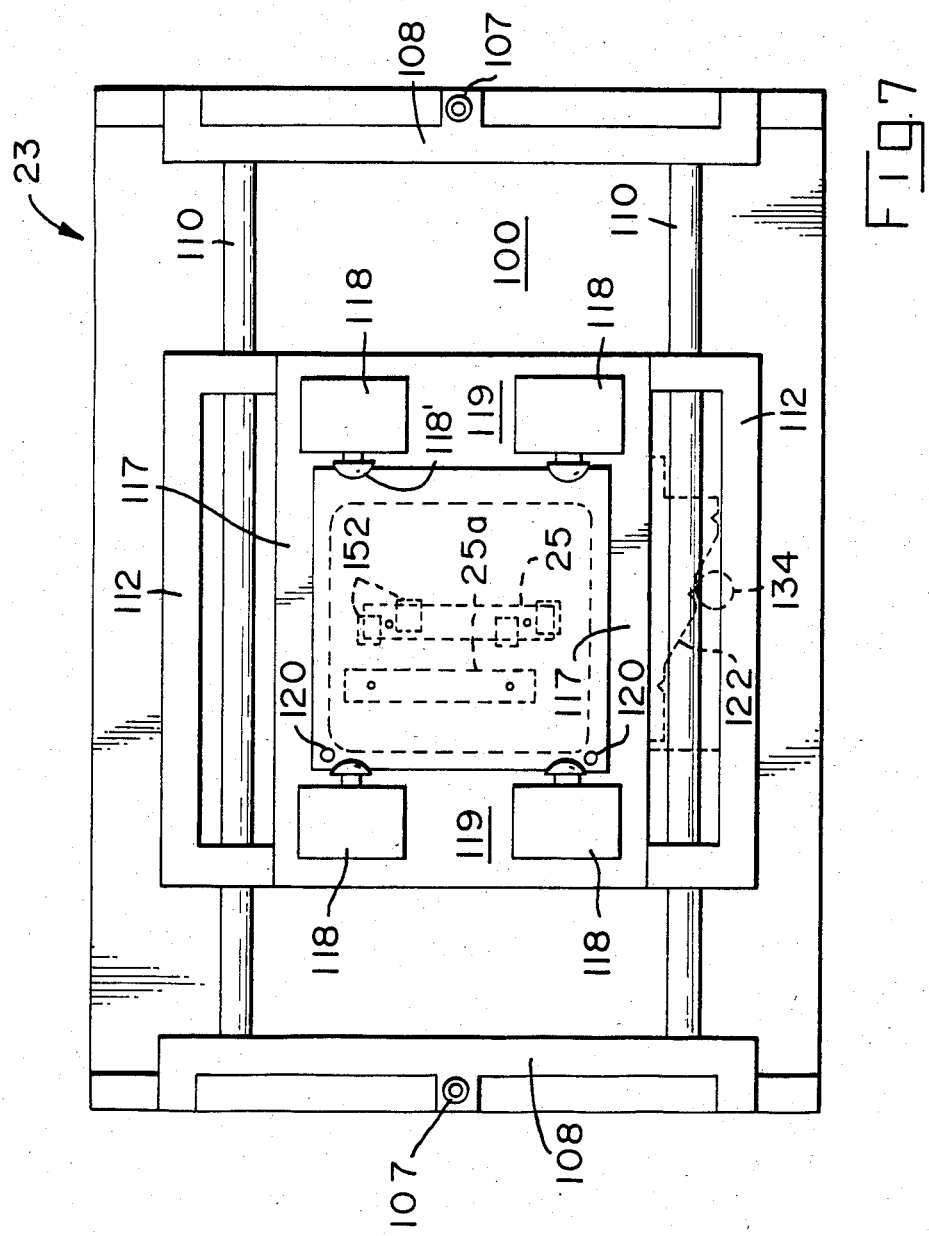
FIG. 7 is a similar view to that of FIG. 6 but showing the shuttle in a second position.

According to the program, the connector 25a is required to be located on the board 19 at a position longitudinally offset from that of the connector 25 as indicated in FIGS. 6 and 7. The cam tracks 122 are so configured that when the connector 25a has been placed on the board 19 and the shuttle 112 is advanced by the movement of the head 20 in the direction of the arrow X, the jaw carriages 130 are appropriately shifted in the direction of the arrows Y to allow the rivets 164 of the connector 25a to be received between the jaws 152 of the respective pairs, upon the horizontal movement of the head 20 being stopped, after which the jaws 152 are closed to clinch the rivets 164 of the connector 25a.

The cam tracks 122 may be configured to allow any convenient number of connectors to be clinched to the board 17 at positions which are longitudinally offset from each other in the direction of the arrows Y.

When the program has been completed, the head 20 is moved horizontally, in the direction opposite to that of the arrow X, and whilst still engaged with the last connector to be placed on the board 19, to return the shuttle 112 to its starting position, the head 20 is again raised, the board 19 is removed from the station 23 and the unit 154 is actuated to return the carriages 130 to their outward starting positions.

We claim:

1. A pick-up head for use in picking up a workpiece having a pair of hollow rivets depending in spaced relationship from a lower surface thereof and opening into an upper surface thereof, and moving the workpiece towards a board to place said lower surface thereof, thereby to insert said rivets into predetermined holes in the board, the pick-up head comprising:
   a body having a central vertical axis and upper and lower faces;
   means on said upper face for attaching said body to a longitudinally movable shaft with said central axis coincident with the axis of the shaft;
   first and second pins slidably mounted in said body and extending parallel to said central axis at positions spaced therefrom, said pins being disposed on opposite sides of said axis and having free end portions projecting below said lower face and terminating in tapered spigots for reception in said hollow rivets; and
   a vacuum block slidably mounted for vertical movement in said body between said pins;
   an evacuable manifold in said body having means for connection to an evacuating pump and opening between said free end portions, for engagement with the upper surface of said workpiece; and
   first and second springs connected to said pins and said vacuum block, respectively, and against the action of which said pins and said vacuum block are movable upwardly in said body.

2. A pick-up head according to claim 1, wherein said second springs are softer than said first springs.

3. A pick-up head according to claim 1, wherein said body comprises a front plate and a back plate which are secured together and which cooperate to define a slide way for said vacuum block, said vacuum block having splines projecting therefrom, and being slidably engaged in vertical grooves in said plates.

4. A pick-up head according to claim 3, wherein said pins are received in countersunk bores in one of said plates, said second springs being received in bores in said vacuum block, the body having a top plate attached to said shaft, said first springs acting between said first pins and said top plate and said second springs acting between said vacuum block and said top plate.

5. Apparatus according to claim 1, wherein said manifold comprises a horizontal blind bore in said vacuum block, connected to an air pipe for connection to said vacuum pump, a series of vertical bores communicating with said blind bore and with a lower face of said vacuum block which is parallel to said lower face of said body.

6. A pick-up head according to claim 1, wherein each pin has a flat end face from which said spigot projects, the spigot having a portion of constant circular cross section adjacent to said flat face and said spigot terminating in a tapered and pointed free end portion.

* * * * *